United States Patent
Rothenberg

[19]

[11] Patent Number: 5,864,257
[45] Date of Patent: Jan. 26, 1999

[54] REPLICA BIAS CIRCUIT TO OPTIMIZE SWING OF DIFFERENTIAL OP-AMP

[75] Inventor: Bret C. Rothenberg, Los Altos, Calif.

[73] Assignee: Exar Corporation, Fremont, Calif.

[21] Appl. No.: 892,399

[22] Filed: Jul. 15, 1997

[51] Int. Cl.[6] .................................................. H03F 3/45
[52] U.S. Cl. ...................................... 330/253; 330/258
[58] Field of Search .................................. 330/258, 311, 330/261, 253, 9; 323/313, 314

[56] References Cited

U.S. PATENT DOCUMENTS 5,212,455  5/1993  Pernici et al. ............................ 330/253
5,565,813  10/1996  Connell et al. ........................... 330/261

Primary Examiner—Robert J. Pascal
Assistant Examiner—Khanh Van Nguyen
Attorney, Agent, or Firm—Townsend and Townsend and Crew LLP

[57] ABSTRACT

A replica circuit derived from the bias generating circuit for an amplifier. The replica circuit duplicates the operating point of the op-amp transistors, and generates two reference voltages. The average of these two voltages is the optimum common-mode desired output level to maximize differential op-amp swing. Several circuits are disclosed that make use of these two voltages to set the op-amp output to the average of the two voltages.

7 Claims, 2 Drawing Sheets

REPLICA BIAS CIRCUIT TO OPTIMIZE SWING OF DIFFERENTIAL OP-AMP

BACKGROUND OF THE INVENTION

The present invention relates to differential amplifiers, and in particular to circuits for providing a common-mode feedback to such an amplifier.

Differential amplifiers typically have an output common-mode level desired signal provided to them. The common-mode feedback will adjust the output common-mode level in the amplifier to match the common-mode desired level through negative feedback. It is desirable to set a common-mode output level that gives the largest differential output swing possible.

Typically, a common-mode desired voltage signal is generated globally and distributed to individual amplifiers. A typical method of generating such a signal is to use a resistor divider between the positive voltage supply and negative voltage supply. This signal is then provided to the individual amplifiers as the desired common-mode signal.

SUMMARY OF THE INVENTION

The present invention realizes that the ideal common-mode voltage point in a differential amplifier is affected by the transistor threshold variations, power supply variations, and other non-ideal conditions. Accordingly, the present invention provides a replica circuit. The replica circuit duplicates the operating point of the cascode transistors in the amplifier, and generates two reference voltages, the average of which is the optimum common-mode output voltage. Two replica signals are produced, corresponding to the transistors above and below the output of the amplifier.

In one embodiment, the two new reference signals are provided to a switched-capacitor interpolation circuit, instead of using a desired common-mode signal from the resistor divider of the prior art. In one embodiment, the interpolation circuit is a sample and hold circuit, and in another embodiment it is an integrator circuit.

In another embodiment, continuous-time common-mode feedback is used instead. The new reference voltages from the bias circuit are instead provided to a resistor interpolator and then to an feedback amplifier. The other input to the feedback amplifier is the average of the positive and negative outputs of the op-amp.

For a further understanding of the nature and advantages of the invention, reference should be made to the following description taken in conjunction with the accompanying drawings.

DESCRIPTION OF THE PREFERRED EMBODIMENT

Figure 1:
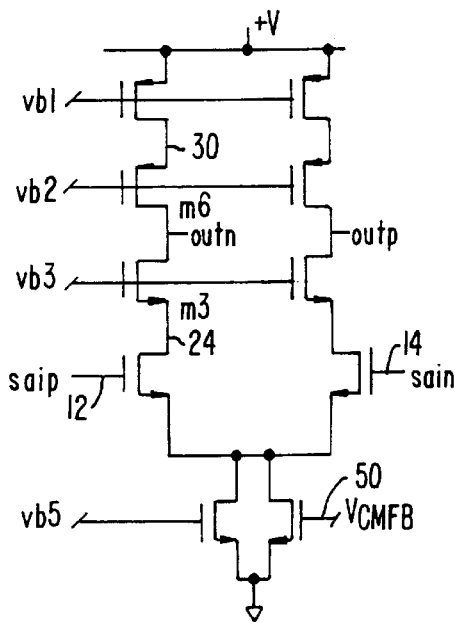
FIG. 1 is a diagram of a telescopic cascode operational amplifier as in the prior art.
Figure 2:
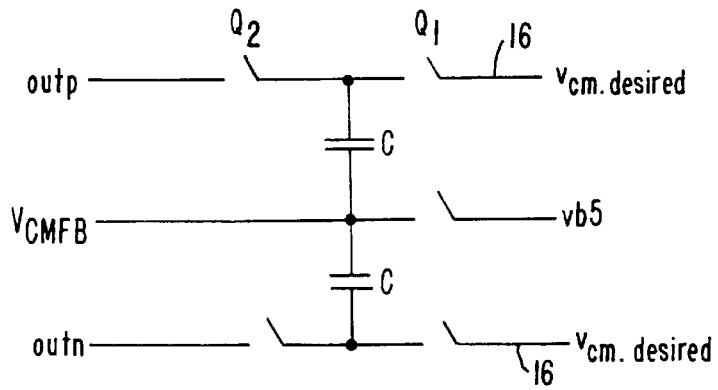
FIG. 2 is a diagram of a switched-capacitor common-mode feedback circuit used in the prior art.

Shown in FIG. 1 is a standard telescopic op-amp, with a switched-capacitor common-mode feedback (SC CMFB) circuit shown in FIG. 2. The common-mode output level of this op-amp is set up by the SC CMFB. In steady-state, the common-mode half-circuit of the SC CMFB looks like a sample and hold amplifier. During phase 1, the voltage Vb5−Vcm_desired is sampled, during phase 2, the capacitor is inserted in feedback around the amplifier. This amplifier is in unity-gain feedback, and so the output will be Vb5−(Vb5−Vcm_desired)=Vcm_desired. Typically, Vcm_desired is constructed from a resistive voltage divider across the power supply.

As shown in FIG. 1, the amplifier has an operational amplifier input positive (oaip) on line 12 and an operational amplifier input negative (oain) on line 14. The negative and positive outputs are provided on lines marked outn and outp. It can be seen that the outn output, for example, is inbetween a transistor m6 connected to a voltage reference Vb2 and a transistor m3 connected to a voltage reference Vb3. Since the threshold voltages of these transistors will vary with temperature, bias current, etc., the power supply resistor divider method of providing a common-mode desired voltage will not give a maximum differential output swing. The common-mode desired signal is provided from a resistor divider to lines 16 in FIG. 2, where it is supplied to a sample and hold switched-capacitor network along with an intermediate reference voltage Vb5. Any differences caused by variations in temperature, bias current, power supply and fabrication parameters will especially affect the differential output swing of the operational amplifier when the positive voltage applied to the amplifier in FIG. 1 is small.

Figure 3:
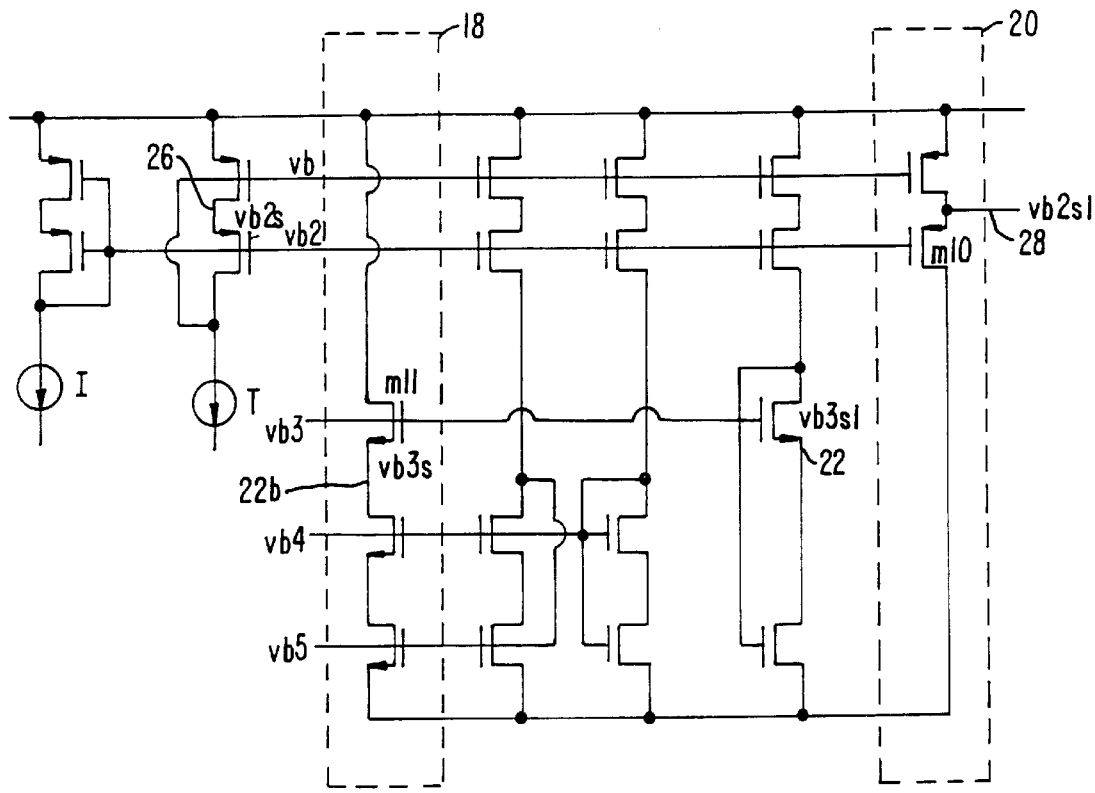
FIG. 3 is a circuit diagram of a bias-generator circuit including the additional replica circuit of the present invention.
Figure 4:
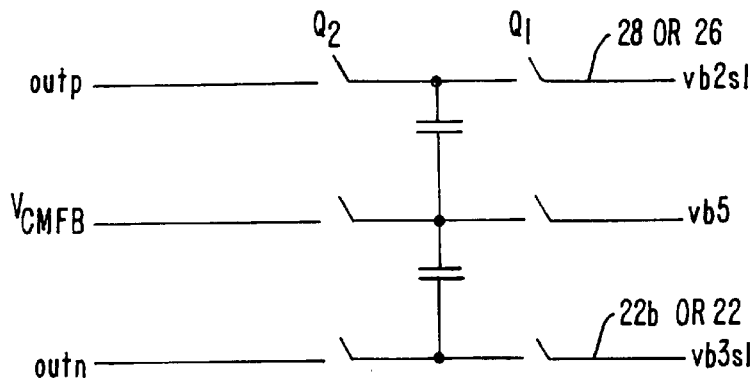
FIG. 4 is a diagram of a sample and hold switched-capacitor circuit receiving the new reference voltages of FIG. 3.
Figure 5:
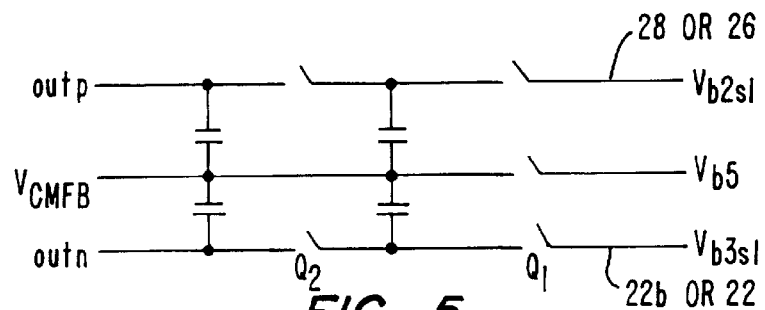
FIG. 5 is a circuit diagram of an integrator switched-capacitor common-mode feedback circuit receiving the new reference voltages of FIG. 3.

The present invention provides a replica circuit that generates a vcm_desired that more closely tracks the optimum common-mode output level of the op-amp. The optimum common-mode output level of the cascoded op-amp is $\frac{1}{2}[(vb3-vt_{m3})+(vb2-vt_{m6})]$. Here, we assume devices m3 and m6 are sized so that $Vgs_{m6}-vt_{m6}$ and $Vgs_{m3}-vt_{m3}$ are similar voltages. This invention provides a new bias generator as shown in FIG. 3, and reconfigures the SC CMFB circuit as shown in FIGS. 3, 4 or 5. The common-mode half circuit for the reconfigured CMFB now generates a vcm_desired=$\frac{1}{2}(vb3-vt_{m3})+(vb2-vt_{m6})$].

FIG. 3 shows a bias-generator circuit which includes new portions indicated by dotted lines 18 and 20. As can be seen, block 18 includes a number of replica transistors corresponding to one side of the amplifier of FIG. 1. As shown, a node labeled Vb3s is picked off from the source of transistor m11, which has its gate connected to Vb3. However, instead of using this signal directly, an equivalent signal is picked off at a node 22, identified as Vb3s1. The signal is picked off from this duplicate transistor instead of transistor m11 to avoid parasitic noise coupling and loading of the main bias network. The buffered version is not required in switched capacitor low-frequency applications. This signal corresponds to the position at a node 24 in FIG. 1.

The other new reference voltage generated is from a node 26 and is buffered by block 20. The new reference voltage from node 26 corresponds to a node 30 in FIG. 1.

The two new signals from nodes 26 and 22 are applied to a switched-capacitor common-mode feedback circuit as shown in FIGS. 4 and 5. FIG. 4 shows that the signals from nodes 22 and 26 replace the common-mode desired signal 16 of FIG. 2. FIG. 4 illustrates a sample and hold circuit, while FIG. 5 illustrates an integrator circuit.

Figure 6:
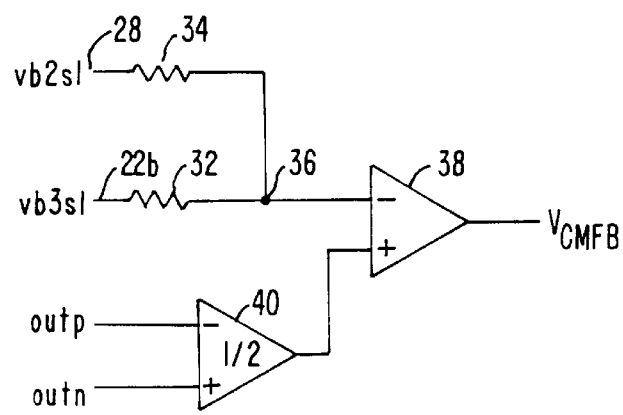
FIG. 6 is a diagram of a continuous-time common-mode feedback circuit using the new reference voltages of FIG. 3.

FIG. 6 illustrates an alternate embodiment of a CMFB circuit. Rather than the circuits of FIGS. 4 and 5, this provides a continuous-time, common-mode feedback. Here, the signals on nodes 22b and 28 (Vb3s1 and Vb2s1) are applied to a resistor interpolator consisting of resistors 32 and 34. The resistor divider of resistors 32 and 34 provides an average signal at a node 36 which is applied as one input of a unity-gain amplifier 38. The other input of amplifier 38 is provided from an amplifier 40, which produces an average of the outn and outp signals. The output of amplifier 38 is the common-mode feedback control input to node 50 of FIG. 1.

Preferably, the resistance of resistors 32 and 34 is large enough to avoid loading blocks 18 and 20 significantly.

The present invention thus optimizes the differential swing in the differential operational amplifier, which is particularly important in low power supply circuits. The optimum setting provided tracks variations in bias current, power supply and fabrication parameters.

As will be understood by those of skill in the art, the present invention may be embodied in other specific forms without departing from the spirit or essential characteristics thereof. Accordingly, the foregoing description is intended to be illustrative, but not limiting, of the scope of the invention which is set forth in the following claims.

What is claimed is:

1. A common mode feedback circuit for a telescopic cascode amplifier having an output between a first transistor connected to a first voltage reference (Vb2), and a second transistor connected to a second voltage reference (Vb3), said circuit comprising:
   an interpolation circuit having first and second inputs for a desired common mode voltage; and
   a bias generation circuit configured to generate
       a third voltage reference (Vb2s1) corresponding to said first voltage reference (Vb2) less a transistor threshold voltage, and
       a fourth voltage reference (Vb3s1) corresponding to said second voltage reference (Vb3) less a transistor threshold voltage;
   said third and fourth voltage references being coupled to said first and second inputs of said interpolation circuit.

2. The circuit of claim 1 wherein said interpolation circuit comprises a switched capacitor circuit.

3. The circuit of claim 2 wherein said switched capacitor circuit is a sample and hold circuit.

4. The circuit of claim 2 wherein said switched capacitor circuit is an integrator circuit.

5. The circuit of claim 1 wherein said bias generation circuit includes
   a duplicate transistor arrangement corresponding to a transistor arrangement of said telescopic amplifier, said duplicate transistor arrangement including a first bias transistor corresponding to said first transistor, and a second bias transistor corresponding to said second transistor,
   wherein said third reference voltage is provided from the source of a first duplicate bias transistor in parallel with said first bias transistor, and
   wherein said fourth reference voltage is provided from the source of a second duplicate bias transistor in parallel with said second bias transistor.

6. A common mode feedback circuit for a telescopic amplifier having an output between a first transistor connected to a first voltage reference (Vb2), and a second transistor connected to a second voltage reference (Vb3), said circuit comprising:
   a switched capacitor interpolation circuit having first and second inputs which will be averaged to generate a desired common mode voltage; and
   a bias generation circuit configured to generate
       a third voltage reference (Vb2s1) corresponding to said first voltage reference (Vb2) less a transistor threshold voltage, and
       a fourth voltage reference (Vb3s1) corresponding to said second voltage reference (Vb3) less a transistor threshold voltage;
   said third and fourth voltage references being coupled to said first and second inputs of said interpolation circuit;
   wherein said bias generation circuit includes
       a duplicate transistor arrangement corresponding to a transistor arrangement of said telescopic amplifier, said duplicate transistor arrangement including a first bias transistor corresponding to said first transistor, and a second bias transistor corresponding to said second transistor,
       wherein said third reference voltage is provided from the source of a first duplicate bias transistor in parallel with said first bias transistor, and
       wherein said fourth reference voltage is provided from the source of a second duplicate bias transistor in parallel with said second bias transistor.

7. A common mode feedback circuit for a telescopic amplifier having an output between a first transistor connected to a first voltage reference (Vb2), and a second transistor connected to a second voltage reference (Vb3), said circuit comprising:
   a bias generation circuit configured to generate
       a third voltage reference (Vb2s) corresponding to said first voltage reference (Vb2) less a transistor threshold voltage, and
       a fourth voltage reference (Vb3s) corresponding to said second voltage reference (Vb3) less a transistor threshold voltage;
   a continuous time feedback circuit including
       first and second resistors for providing an average of said third and fourth voltage references at a first node,
       an averaging amplifier for producing at a second node an average of a positive and negative output of said telescopic amplifier, and
       a unity gain amplifier having said first and second nodes coupled to its inputs, and having an output with a common mode feedback signal.

* * * * *